United States Patent
Kim et al.

(10) Patent No.: US 7,175,476 B2
(45) Date of Patent: Feb. 13, 2007

(54) CROSSTALK CANCELING PATTERN FOR HIGH-SPEED COMMUNICATIONS AND MODULAR JACK HAVING THE SAME

(75) Inventors: Dae Sung Kim, Gunpo-si (KR); Jung Gon Kim, Siheung-si (KR); Jung Suk Lee, Seoul-si (KR); Su Jong Kim, Anyang-si (KR)

(73) Assignee: Daeun Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/327,897

(22) Filed: Jan. 9, 2006

(65) Prior Publication Data

US 2006/0154531 A1  Jul. 13, 2006

(30) Foreign Application Priority Data

Jan. 11, 2005 (KR) .................. 10-2005-0002690
Jan. 18, 2005 (KR) .................. 20-2005-0001481
Nov. 17, 2005 (KR) .................. 20-2005-0032523

(51) Int. Cl.
*H01R 13/66* (2006.01)

(52) U.S. Cl. .................. 439/620.11; 439/941

(58) Field of Classification Search .......... 439/620.11, 439/17, 23, 941
See application file for complete search history.

(56) References Cited

U.S. PATENT DOCUMENTS 5,915,989 A * 6/1999 Adriaenssens et al. ...... 439/404
6,176,742 B1 * 1/2001 Arnett et al. .......... 439/620.23
6,196,880 B1 * 3/2001 Goodrich et al. ........... 439/676
6,396,716 B1 * 5/2002 Liu et al. ...................... 363/17
6,402,560 B1 * 6/2002 Lin ............................ 439/676
6,819,181 B2 * 11/2004 Stengel et al. .............. 330/286
2004/0184247 A1 * 9/2004 Adriaenssens et al. ...... 361/766
2005/0181676 A1 * 8/2005 Caveney et al. ............ 439/676
2005/0277339 A1 * 12/2005 Caveney et al. ............ 439/676

* cited by examiner

*Primary Examiner*—Ross Gushi
*Assistant Examiner*—Larisa Tsukerman
(74) *Attorney, Agent, or Firm*—Volpe and Koenig, PC

(57) ABSTRACT

Disclosed herein are a crosstalk canceling pattern for high-speed communications and a modular jack having the same, which includes a compensating capacitor on a transmission line to cancel crosstalk due to parasitic capacitance generated between neighboring insert pins, and includes a second compensating capacitor to correct phase mismatch due to parasitic inductance generated in insert pins and transmission lines, when a high-frequency signal is applied. The modular jack having the crosstalk canceling pattern for high-speed communications includes a housing, a printed circuit board, a lower contact block, and an upper contact block. The hosing includes a plug insert hole, an insert pin locking plate, and a coupling guide part. The printed circuit board is a multi-layered structure having a plurality of compensating capacitors. The lower contact block is mounted to the lower surface of the printed circuit board. The upper contact block is mounted to the upper portion of the lower contact block, and divides UTP cable wires to be connected to IDC terminals.

23 Claims, 14 Drawing Sheets

CROSSTALK CANCELING PATTERN FOR HIGH-SPEED COMMUNICATIONS AND MODULAR JACK HAVING THE SAME

BACKGROUND OF THE INVENTION

1. Field of the Invention

The present invention relates generally to a modular jack for high-speed communications, capable of transmitting up to 250 MHz per pair in UTP 4 pair cable and, more particularly, to a crosstalk canceling pattern for high-speed communications and a modular jack having the same, which includes an additional compensating capacitor on a transmission line adjacent to IDC terminals so as to correct phase mismatch due to inductance generated in insert pins and transmission lines, in addition to canceling first parasitic capacitance generated between neighboring insert pins, when a high-frequency signal is applied to the modular jack for high-speed communications, thus satisfying performance requirements for Category 6, and eliminating a soldering process, therefore ensuring a high quality when used in a network.

2. Description of the Related Art

Generally, when a user desires to transmit data or voice using a terminal, such as a computer or a telephone, the terminal must be connected to a communication cable, which extends into an apartment unit or an office. A modular plug and a modular jack have been used as a connection means.

FIG. 1 is an exploded perspective view showing an example of a conventional modular jack. As shown in the drawing, the conventional modular jack 1 includes a housing 10 and a connector 20 mounted to the rear surface of the housing 10.

The housing 10 is produced by forming a synthetic resin material. A plug insert hole 11 is formed in the front surface of the housing 10 so that a modular plug 2 is inserted into the plug insert hole 11. A mounting part is provided on the rear surface of the housing 10 so that the connector 20 is mounted to the housing 10. The connector 20 serves to electrically connect the modular plug 2 to an incoming cable. An insert 60 is provided to one side of the connector 20 to be electrically connected to a terminal of the modular plug 2, and a plurality of IDC terminals 51 is provided to an opposite side of the connector 20 to be connected to the incoming UTP cable. Further, the insert 60 and the IDC terminals 51 are electrically connected to each other through transmission lines formed on a printed circuit board 50. Meanwhile, an IDC-type terminal block 30 is coupled to the IDC terminals 51 to allow the IDC terminals 51 to be easily connected to a wire of the UTP cable. A contact block 40 is mounted on the IDC-type terminal block 30 to press and insert the wire.

Thus, the wire W of the UTP cable is connected to the IDC terminals 51 through the IDC-type terminal block 30 and the contact block 40. When the modular plug 2 is inserted into the plug insert hole 11 of the housing 10, the terminal of the modular plug 2 is connected to insert pins 61 of the insert 60, thus permitting data or voice communication.

FIG. 2 is a sectional view showing the connector 20 of the conventional modular jack.

As shown in the drawing, the insert 60 is installed on one side of the printed circuit board 50 having a predetermined size, and the IDC terminals 51 are vertically installed on an opposite side of the printed circuit board 50. In this case, the insert 60 includes an insert body 62 and a plurality of insert pins 61 secured to the insert body 62. The insert pins 61 are electrically connected to the transmission lines through contact holes which are formed in the printed circuit board 50. Further, in order to cancel crosstalk due to parasitic capacitance generated between neighboring insert pins 61, a compensating capacitor 52 is provided on the printed circuit board 50. The compensating capacitor 52 comprises leads which are arranged near each other and have a predetermined length so as to generate an inverse-phase capacitance on a corresponding transmission line.

Thus, as shown in the equivalent circuit diagram of FIG. 2, when a low-frequency signal is applied to the conventional modular jack 1, parasitic capacitance A is generated between neighboring insert pins 61, which are pressed by the terminal of the modular plug 2 to be parallel to each other, so that crosstalk is generated. However, the crosstalk generated in the insert pins 61 is canceled by inverse-phase capacitance C which is generated in the compensating capacitor 52 formed on the printed circuit board 50. Thus, the conventional modular jack 1 can perform low-speed communication under 100 MHz, for example, satisfying the performance requirements for Category 5.

However, as shown in the equivalent circuit diagram of FIG. 3, when the high-frequency signal exceeding, for example, 250 MHz, is applied to the conventional modular jack 1, first and second parasitic inductance B and D is generated in the insert pins 61, the transmission line between the insert pins 61 and the compensating capacitor 52, and the transmission line between the compensating capacitor 52 and the IDC terminals 51. That is, the first parasitic inductance B is generated in the insert pins 61 and the transmission line between the insert pins 61 and the compensating capacitor 52, while the second parasitic inductance D is additionally generated in the transmission line between the compensating capacitor 52 and the IDC terminals 51.

As such, since-impedance hindering the current flow in the insert pins and the transmission lines, that is, reactance, is increased in a high-frequency area, it is impossible to completely cancel crosstalk simply by forming the compensating capacitor 52 on the printed circuit board 50. Thus, the conventional crosstalk canceling pattern and modular jack are problematic in that it is impossible to satisfy the performance requirements for Category 6, whose maximum transmission frequency is 250 MHz or higher.

Further, the insert pins 61 and the IDC terminals 51 passing through the printed circuit board 50 are secured to the lower surface of the printed circuit board through soldering, and are connected to the transmission lines. At this time, a canceling pattern formed on the printed circuit board may be stained with flux, used to prevent surface oxidation due to high temperature during a soldering process, so that contact points are unstable, thus leading to poor contact. Further, it reduces insulation resistance value. In order to avoid such a problem, a post operation is required.

SUMMARY OF THE INVENTION

Accordingly, the present invention has been made keeping in mind the above problems occurring in the prior art, and an object of the present invention is to provide a crosstalk canceling pattern for high-speed communications and a modular jack having the same, which minimizes parasitic capacitance generated between neighboring insert pins so as to satisfy performance requirements for Category 6, capable of transmitting 250 MHz per pair in UTP 4 pair cable, and which minimizes parasitic inductance generated in the insert pins and parasitic inductance generated in a transmission line between the insert pins and a compensating capacitor.

Another object of the present invention is to provide a crosstalk canceling pattern for high-speed communications and a modular jack having the same, which additionally includes a second compensating capacitor that generates compensating capacitance in a transmission line adjacent to IDC terminals so as to correct phase mismatch caused by capacitance generated in insert pins and a compensating capacitor and inductance generated in the insert pins and the transmission line, thus satisfying performance requirements for category 6.

A further object of the present invention is to provide a crosstalk canceling pattern for high-speed communications and a modular jack having the same, constructed so that first parasitic capacitance and first parasitic inductance generated in front of a first compensating capacitor are symmetrical to second parasitic capacitance and second parasitic inductance generated in back of the first compensating capacitor.

Still another object of the present invention is to provide a crosstalk canceling pattern for high-speed communications and a modular jack having the same, which eliminates a soldering process for securing the insert pins and the IDC terminals, achieves miniaturization to afford convenient mass production, and minimizes the insertion, coupling, and removal of UTP cables, thus having a high quality used in a network.

In order to accomplish the above object, the present invention provides a crosstalk canceling pattern for high-speed communications and a modular jack having the same, which is manufactured by assembling a housing with upper and lower contact blocks having a printed circuit board as a connector. A modular plug is inserted into the front surface of the housing.

The modular jack includes a plurality of insert pins electrically connected to a modular plug, a plurality of IDC terminals connected to an UTP cable, a printed circuit board connecting the insert pins to the IDC terminals via a transmission line, and a first compensating capacitor provided on a transmission line of the printed circuit board to compensate for first parasitic capacitance generated between the insert pins. In this case, first parasitic inductance generated in the insert pins and a transmission line between the insert pins and the first compensating capacitor, and second parasitic inductance generated in a transmission line between the first compensating capacitor and the IDC terminals are symmetrical with respect to the first compensating capacitor.

Further, the modular jack also includes a second compensating capacitor, generating second compensating capacitance. The second compensating capacitor is provided in a transmission line adjacent to the IDC terminals so as to correct phase mismatch, due to an increase in capacitance caused by the first compensating capacitor and an increase in the first and second parasitic inductance.

The modular jack is constructed so that generation of the first parasitic capacitance and the first parasitic inductance generated in front of the first compensating capacitor is limited to be as small as possible, thus allowing the first parasitic capacitance and the first parasitic inductance to be more easily symmetrical to the second parasitic inductance and the second compensating capacitance generated in back of the first compensating capacitance.

The insert pins are vertically installed in such a way as to be spaced apart from each other by a predetermined distance in front and rear directions, so that inclination angles of the neighboring insert pins are differently changed when the insert pins are pressed by the modular plug, and the insert pins are not arranged to be parallel to each other but are staggered. Each of the insert pins is formed to be as short as possible, thus minimizing the magnitude of the parasitic inductance generated in the insert pins.

The first compensating capacitor is installed as near the insert pins as possible, thus minimizing the magnitude of the first parasitic inductance generated in the transmission line between the insert pins and the first compensating capacitor. The second parasitic inductance generated in the transmission line between the first compensating capacitor and the IDC terminals is symmetrical to the first parasitic inductance generated in front of the first compensating capacitor.

The printed circuit board comprises three substrates and four patterned layers, transmission lines extending from the insert pins to the IDC terminals are formed on an upper surface of an upper substrate and a lower surface of a lower substrate, and the first compensating capacitor for compensating the first parasitic capacitance generated in the insert pins and the second compensating capacitor for correcting phase mismatch due to compensating capacitance and parasitic inductance are provided on upper and lower surfaces of a middle substrate.

The upper and lower substrates are compressed to be secured to the upper and lower surfaces of the middle substrate, respectively. The printed circuit board is made of a material having a dielectric constant of 3.0 or higher, thus preventing capacitive coupling in a high-frequency area. The middle substrate has ample thickness of 1.6 mm or higher.

Further, the present invention provides a crosstalk canceling pattern installed on a printed circuit board of a modular jack for high-speed communications and canceling crosstalk, wherein the printed circuit board comprises three substrates, transmission lines extending from insert pins to IDC terminals are formed on an upper surface of an upper substrate and a lower surface of a lower substrate, and a first compensating capacitor for compensating for first parasitic capacitance generated in the insert pins and a second compensating capacitor for correcting phase mismatch due to compensating capacitance generated in the first compensating capacitor and parasitic inductance generated in the insert pins and the transmission lines are provided on upper and lower surfaces of a middle substrate.

The first compensating capacitor is installed near the insert pins, and the second compensating capacitor is installed near the IDC terminals.

Further, the present invention provides a crosstalk canceling pattern for high-speed communications, having a first compensating capacitor which generates inverse-phase compensating capacitance so as to offset parasitic capacitance generated between a plurality of insert pins, wherein a second compensating capacitor is provided in back of the first compensating capacitor, and generates second compensating capacitance to correct phase mismatch due to parasitic capacitance and inductance generated in front of the first compensating capacitor, and the magnitude of first parasitic capacitance and second parasitic inductance is minimized so that the first parasitic capacitance generated in front of the compensating capacitance and first parasitic inductance generated in the insert pins and a transmission line between the insert pins and the compensating capacitor, are symmetrical to second compensating capacitance generated in back of the compensating capacitance and second parasitic inductance generated in a transmission lines between the compensating capacitor and IDC terminals.

The modular jack includes a housing into which a modular plug is inserted, upper and lower contact blocks into which an UTP cable is introduced, and a printed circuit board to connect insert pins, electrically connected to the modular plug, to a plurality of IDC terminals connected to the UTP cable via a transmission line. In this case, the insert pins electrically connected to the modular plug and the IDC terminals electrically connected to the UTP cable are electrically connected to the printed circuit board through transmission lines. The printed circuit board is mounted to the lower portion of the lower contact block, and the upper contact block is mounted to the upper portion of the lower contact block, with the UTP cable inserted into the upper contact block. The assembly of the printed circuit board and the upper and lower contact blocks is mounted to the rear portion of the housing.

The housing includes a plug insert hole formed in a front surface of the housing so that the modular plug is tightly inserted into the plug insert hole, an insert pin locking plate provided on a lower portion of the plug insert hole so that the insert pins inserted through a rear portion of the housing are locked to the insert pin locking plate, and a coupling guide part integrally provided on the rear portion of the housing, and having a size which is suitable for accommodating a lower surface of the lower contact block.

The insert pins are locked to the insert pin locking plate, and contact the transmission line of the printed circuit board along the shortest possible distance. The printed circuit board comprises a multi-layered structure having a plurality of compensating capacitors, with the insert pins and the IDC terminals passing through the printed circuit board.

The lower contact block is coupled at a lower surface thereof to the printed circuit board, and includes a plurality of through holes formed at positions corresponding to the IDC terminals, and front and rear rib walls provided to be higher than the IDC terminals passing through the through holes and be lower than the front surface of the housing, so that the lower contact block is slidably coupled to the housing along the coupling guide part thereof.

The upper contact block includes an upper plate having a size suitable for covering the lower contact block, and side plates having terminal insert holes so that the IDC terminals are inserted into the terminal insert holes, so that the upper contact plate divides wires of the UTP cable introduced through a rear portion of the upper contact block, and connect the wires to the IDC terminals.

Each of the insert pins includes an insert part having a length which is suitable for passing through the printed circuit board, a protruding stop part stopped by an upper surface of the printed circuit board, and a bent part provided on an upper end of the stop part. Further, the insert part of each of the insert pins passes vertically through an associated pin contact hole of the printed circuit board to be connected to the transmission line, the stop part of each of the insert pins is stopped by the upper surface of the printed circuit board in such a way as to be in surface contact with the printed circuit board, and the bent part of each of the insert pins is bent toward the rear portion of the housing and is inclined at a predetermined angle to be in surface contact with a terminal of the modular plug.

Further, the coupling guide part of the housing comprises a "U"-shaped plate which is open at an upper portion thereof, with locking holes and slide grooves being formed on rear portions of side walls of the coupling guide part. The insert pin locking plate has a height which is suitable for accommodating a length of the stop part of each of the insert pins, and is positioned to be perpendicular to the front surface of the housing, with pin guide grooves having different depth being provided on a rear portion of the insert pin locking plate in such a way as to be staggered. Preferably, deep pin guide grooves and shallow pin guide grooves are formed to be staggered.

Preferably, the printed circuit board comprises three substrates and four patterned layers, transmission lines extending from the insert pins to the IDC terminals are formed on an upper surface of an upper substrate and a lower surface of a lower substrate, and the first compensating capacitor for compensating the first parasitic capacitance generated in the insert pins and the second compensating capacitor for correcting phase mismatch due to compensating capacitance and parasitic inductance are provided on upper and lower surfaces of a middle substrate.

Two rows of insert pins pass through pin contact holes formed in a front portion of an upper surface of the printed circuit board in such a way as to be spaced apart from each other in front and rear directions in a zigzag manner, and two rows of IDC terminals pass through terminal contact holes formed in left and right sides of a rear portion of the upper surface of the printed circuit board.

Each of the IDC terminals includes a contact part having a length which is suitable for passing through an associated terminal contact hole of the printed circuit board, a terminal body extending from the contact part, having a locking part which protrudes to a side of the terminal body, and having a size to be accommodated in an associated through hole of the lower contact block, and a cutter provided on an upper end of the terminal body and comprising two blades.

The lower contact block integrally includes locking hooks protruding from both side surfaces thereof, and engaging with the locking holes of the housing, a protruding guide part vertically provided on an inner surface of the front rib wall, a lower cable insert hole formed in the rear rib wall, and having a size to allow the UTP cable to be introduced through the rear rib wall, an upper block guide vertically formed on an inner surface of the rear rib wall, and a block locking part provided at a position around the upper block guide, and engaging with a detachable hook of the upper contact block. The lower contact block includes a plurality of through holes, the size of an outlet of each of the through holes being set to allow the cutter of each of the IDC terminals to pass through the outlet and allow the locking part of the terminal body of each of the IDC terminals to be stopped by the outlet.

Further, the upper contact block includes the upper plate comprising a bent surface which is concave at an upper surface thereof, a protective cover protruding from a front end of the upper plate, a guide groove vertically formed on a front surface of the upper contact block, the detachable hook provided on a rear portion of the upper contact block, and locked to the block locking part of the lower contact block, an upper cable insert hole formed in a rear surface of the upper contact block so that the UTP cable is inserted into the upper cable insert hole, wire insert holes formed on lower portions of both side plates of the upper contact block in such a way as to be perpendicular to the terminal insert holes, so that the wires of the cable inserted into the cable insert hole are inserted into the wire insert holes in diagonal directions, and a protrusion protruding from a lower surface of the upper plate, and dividing the wires of the introduced UTP cable, to be inserted into the wire insert holes.

Therefore, the modular jack according to the present invention is constructed so that the printed circuit board having the insert pins is coupled to the lower contact block, the lower contact block having the printed circuit board is mounted to the rear portion of the housing, and the upper contact block is mounted to the upper portion of the lower contact block, so that the wires of the UTP cable wire are pressed to be electrically connected to the IDC terminals. Further, the length between the insert pins and the holes of the printed circuit board becomes short, so that the parasitic inductance generated in the plug and the insert pins is minimized, thus minimizing initial near-end crosstalk in the high-frequency area, and canceling the crosstalk using the compensating capacitor, therefore being useful in the high-frequency area. Further, the wires of the UTP cable can be connected to the rear surface of the modular jack without use of an IDC connection tool, thus allowing workers to easily conduct a cabling operation. A soldering process is not implemented, so that contact failure is reduced, thus increasing efficiency when being used.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Hereinafter, the preferred embodiments of the present invention will be described in detail with reference to the accompanying drawings.

Figure 1:
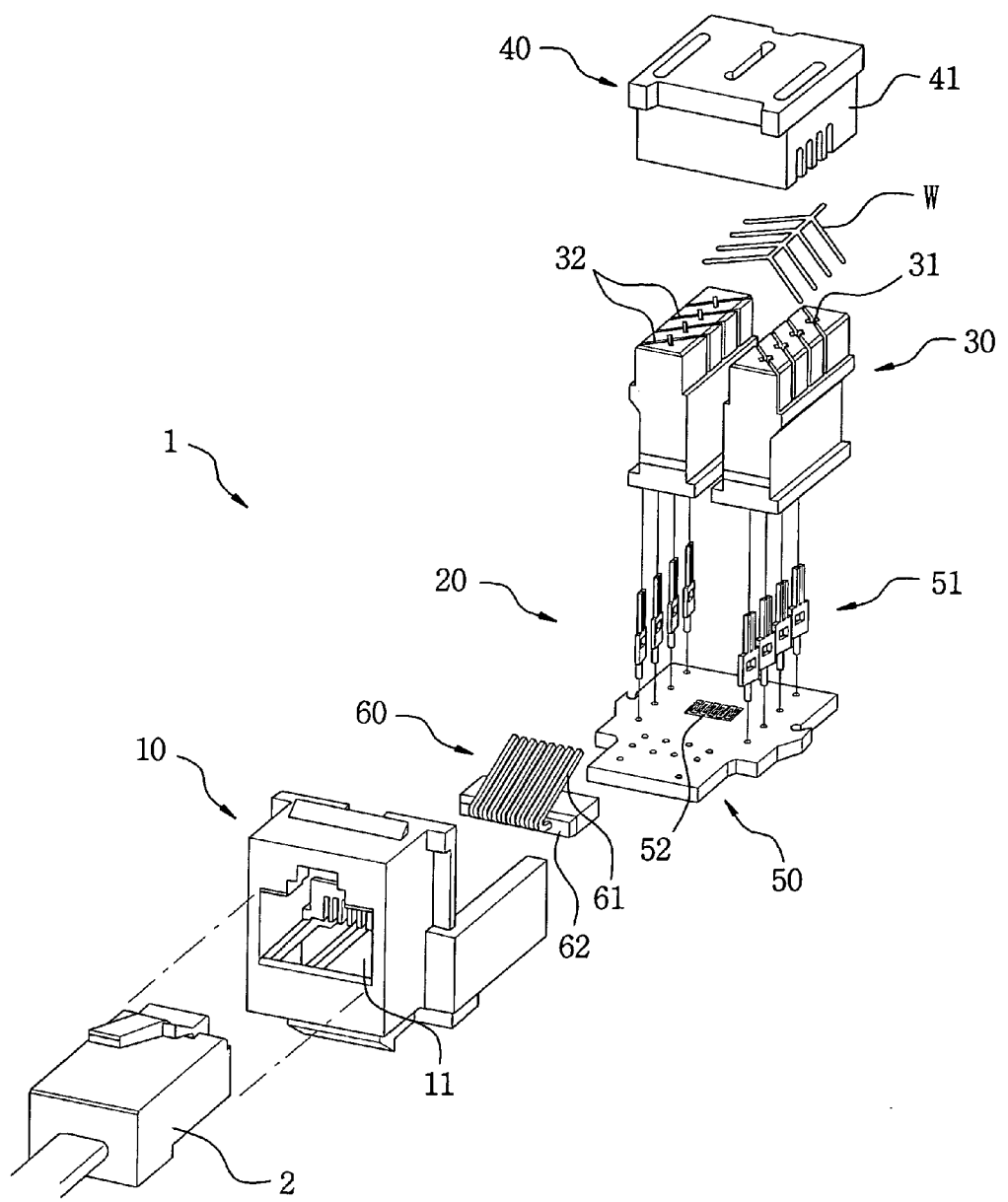
FIG. 1 is an exploded perspective view showing an example of a conventional modular jack.
Figure 2:
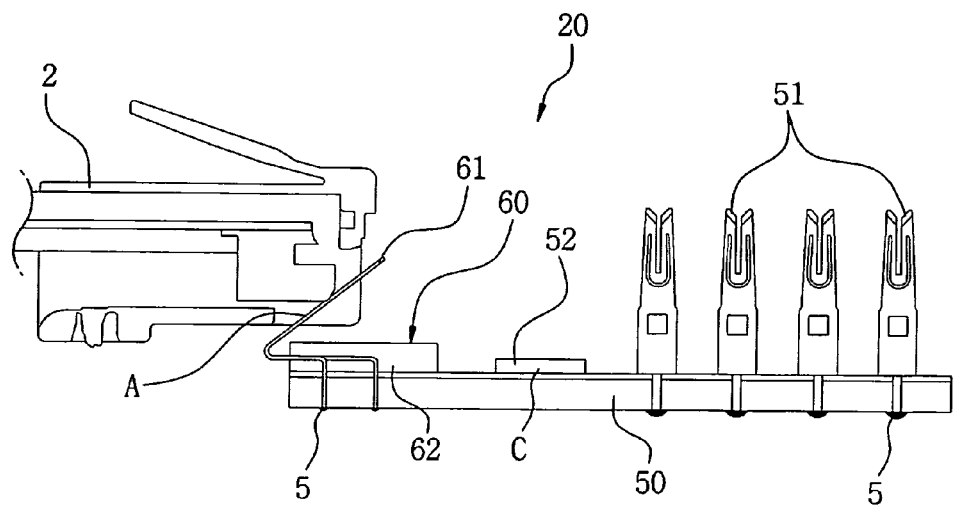
FIG. 2 is a view illustrating a connector of the conventional modular jack in a sectional view and an equivalent circuit diagram.
Figure 2:
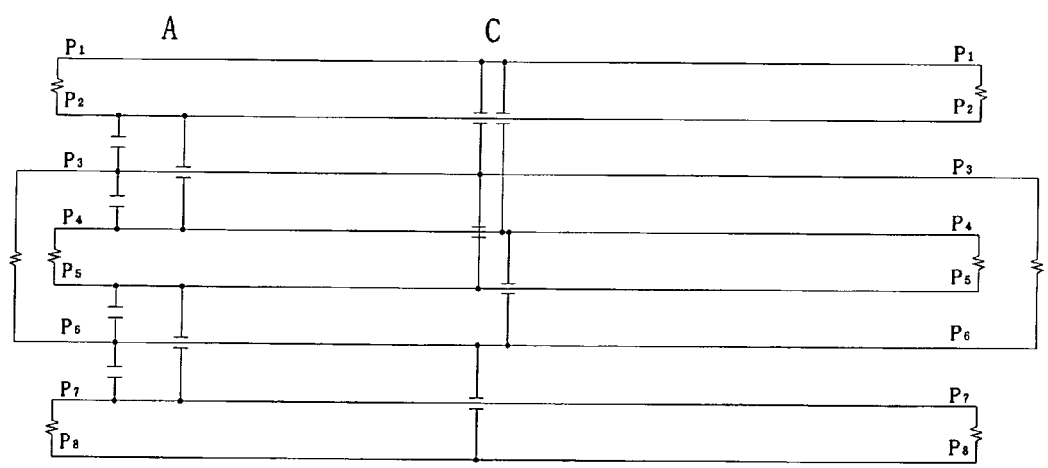
Figure 3:
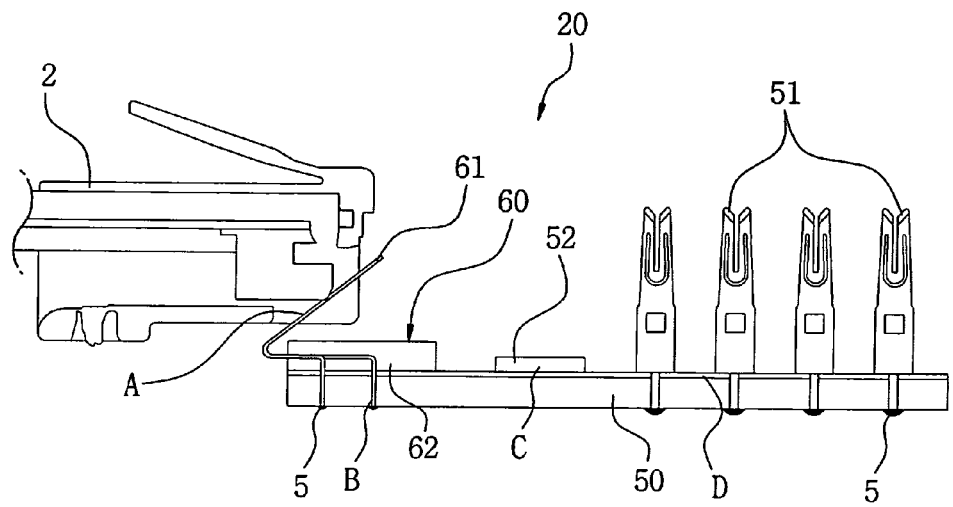
FIG. 3 is an equivalent circuit diagram, when a high-frequency signal is applied to the conventional modular jack.
Figure 3:
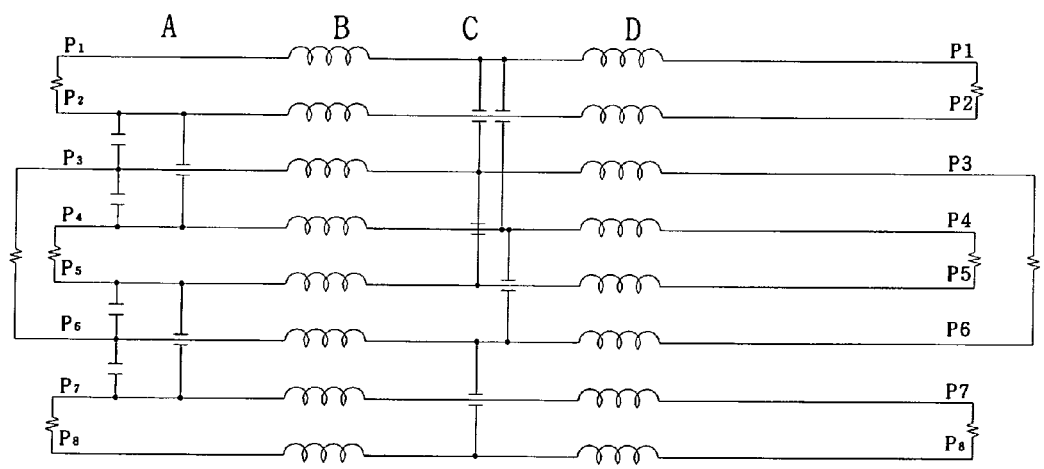
Figure 4A:
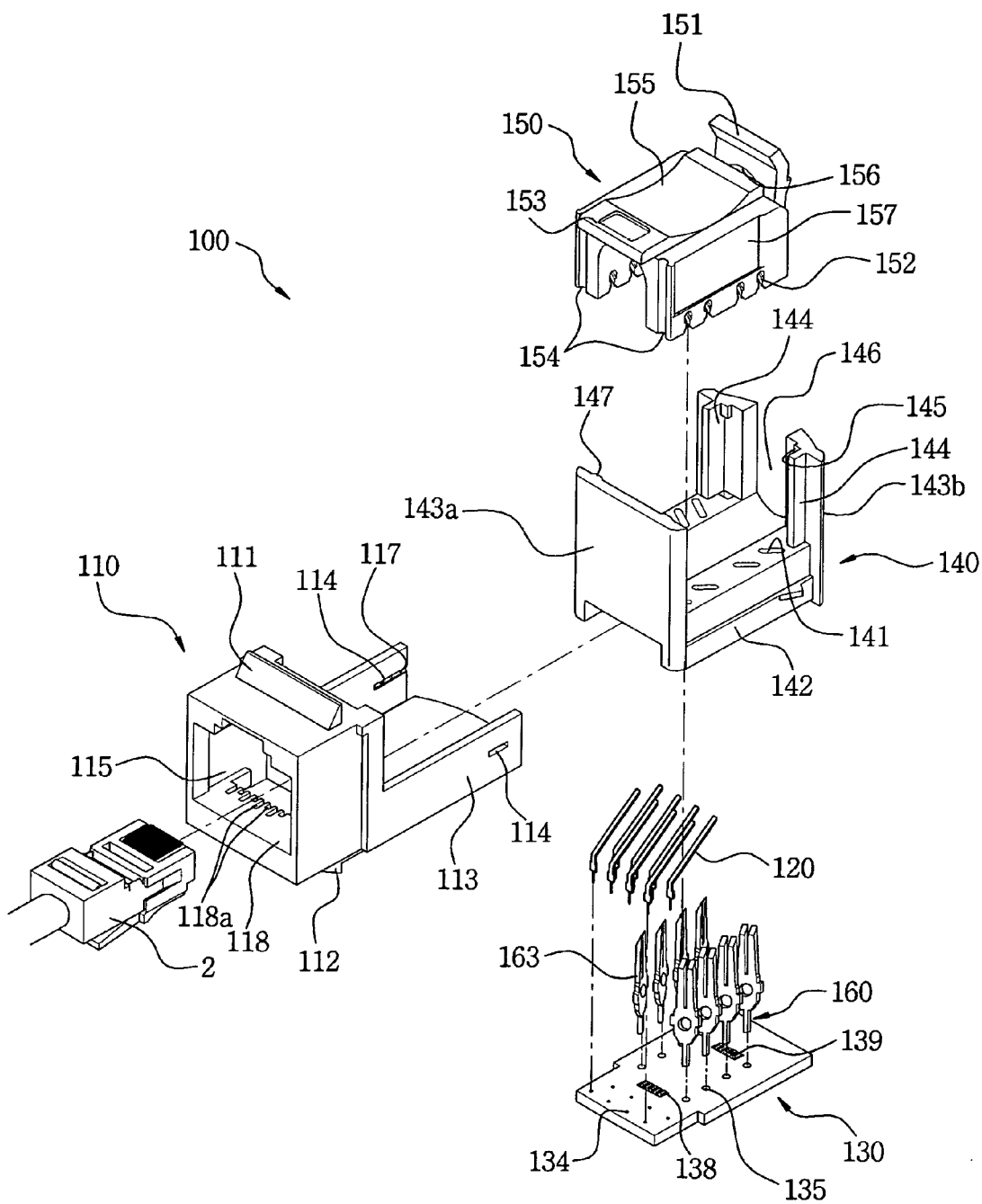
FIGS. 4a and 4b are an exploded perspective view and a perspective view, respectively, showing the preferred embodiment of a modular jack, according to the present invention.
Figure 4B:
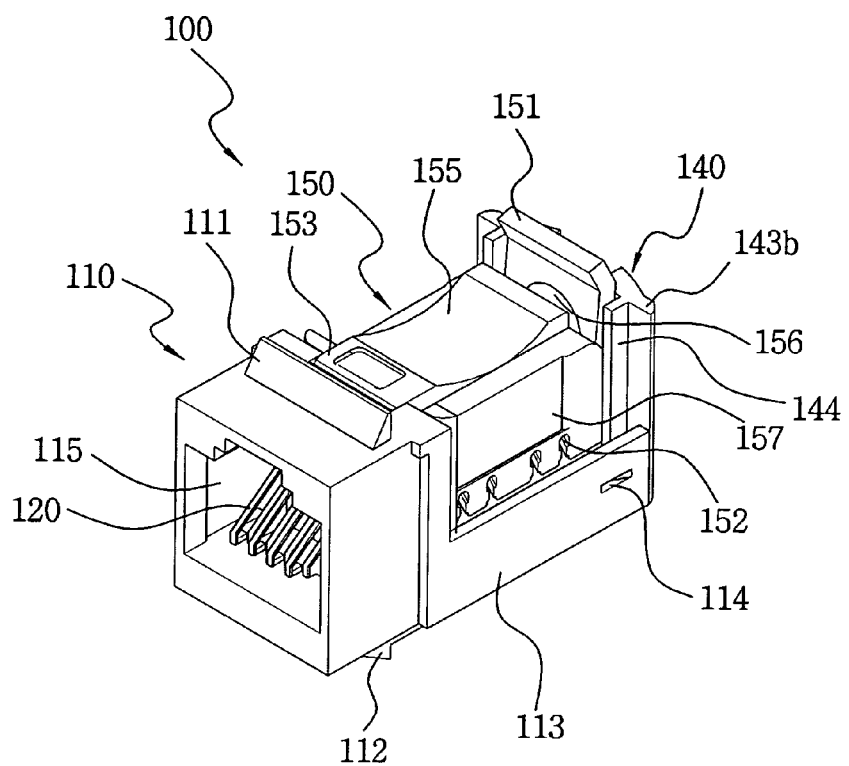
Figure 5A:
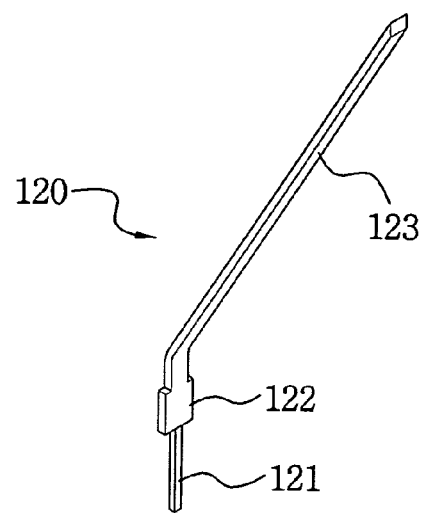
FIGS. 5a and 5b are perspective views showing the preferred embodiment of an insert pin and an IDC terminal, according to the present invention.
Figure 5B:
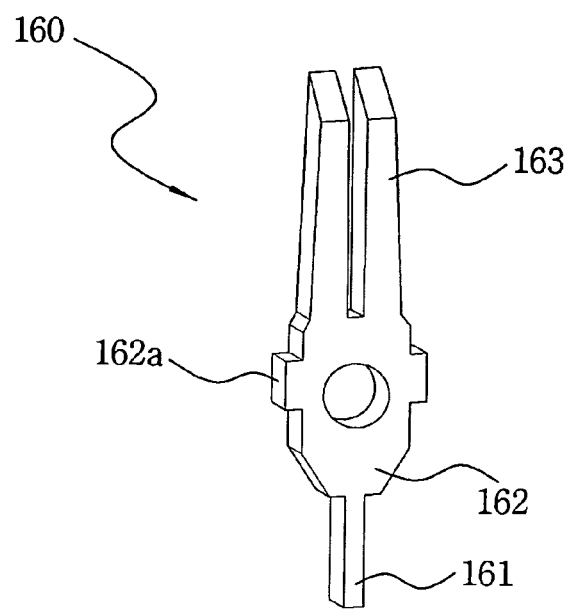

FIGS. 4a and 4b are an exploded perspective view and a perspective view, respectively, showing the preferred embodiment of a modular jack, according to the present invention, and FIGS. 5a and 5b are perspective views showing the preferred embodiment of an insert pin and an IDC terminal.

As shown in the drawings, a modular jack 100 according to this invention includes a housing 110 into which a modular plug 2 is inserted, and a connector which is detachably mounted to the rear surface of the housing 110. In this case, the connector includes a printed circuit board 130, a lower contact block 140, and an upper contact block 150. A plurality of insert pins 120 and IDC terminals 160 pass through the upper surface of the printed circuit board 130. The lower contact block 140 is coupled to the printed circuit board 130, and is detachably mounted to the rear portion of the housing 110. The upper contact block 150 is coupled to the upper portion of the lower contact block 140.

In this case, the printed circuit board 130 is electrically connected to the insert pins 120 and the IDC terminals 160. The insert pins 120 are electrically connected to a transmission line of the printed circuit board 130 through contact holes 134 formed in the printed circuit board 130. In order to compensate for parasitic capacitance generated between neighboring insert pins 120, a compensating capacitor 138 generating inverse-phase compensating capacitance is provided on the printed circuit board 130.

Referring to FIGS. 4a and 5a, two-staged insert pins 120 are inserted into the contact holes 134 of the printed circuit board 130. In this case, each stage comprises 4 insert pins 120. Such an arrangement depends on the positions of the contact holes 134, and minimizes parasitic capacitance and parasitic inductance, which are generated when a high-frequency signal is applied.

Each of the insert pins 120 includes an insert part 121, a stop part 122, and a bent part 123. The length of the insert part 121 is set to pass through the printed circuit board. The stop part 122 having the shape of a rectangular plate is stopped by the upper surface of the printed circuit board. The bent part 123 extends from the upper end of the stop part 122. Further, the insert part 121 of each insert pin 120 vertically passes through an associated contact hole 134 of the printed circuit board, and is connected to transmission lines 137a and 137b such that a distance therebetween is shortest. The stop part 122 is in surface contact with the upper surface of the printed circuit board 130. The bent part 123 is inclined to be in surface contact with a terminal of the modular plug, and is bent towards the rear portion of the housing 110 at a predetermined angle.

Thereby, since the insert pins 120 are connected to the terminal of the modular plug 2 which is inserted into a plug insert hole 115 of the housing 110, and are connected to the printed circuit board 130 such that a distance between the insert pins 120 and a patterned layer of the printed circuit board 130 is shortest, parasitic inductance generated at a position where the modular plug 2 is connected to the insert pins 120 is minimized, thus canceling and minimizing near-end crosstalk.

Figure 6:
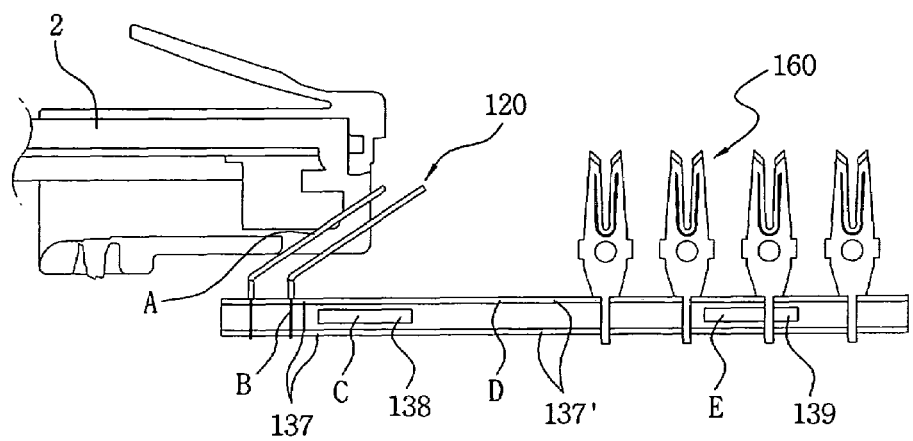
FIG. 6 is a view illustrating a connector of the modular jack, according to the present invention, in a sectional view and an equivalent circuit diagram.
Figure 6:
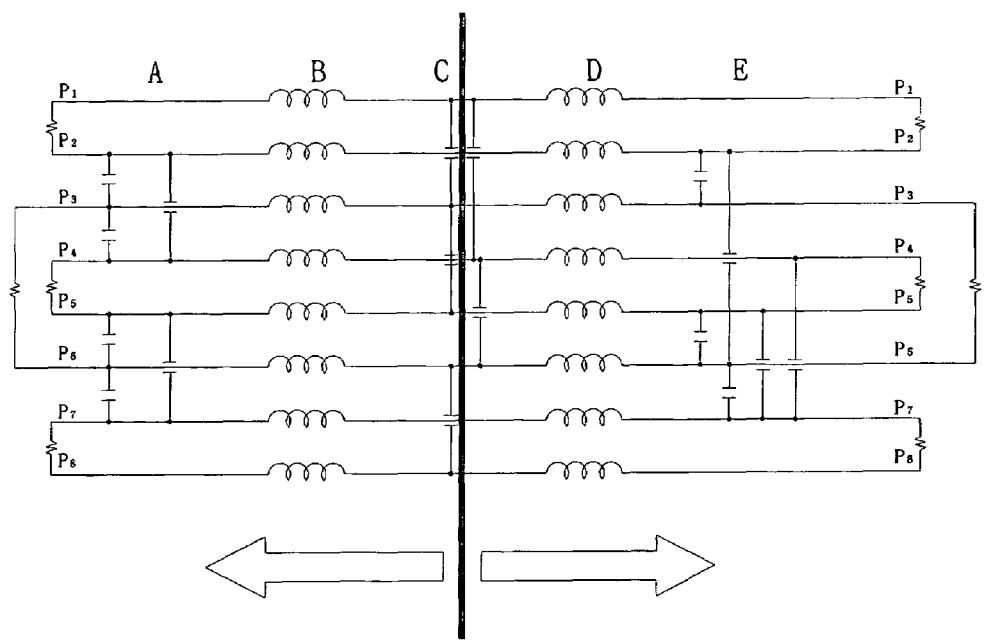

According to this invention, neighboring insert pins 120 are spaced apart from each other by a predetermined distance in front and rear directions. Thus, as shown in FIG. 6, even though the insert pins 120 are pressed rearwards by the terminal of the modular plug 2, the neighboring insert pins 120 have different inclinations, so that they are not arranged in parallel to each other, but instead are staggered. Thereby, parasitic inductance A generated between the neighboring insert pins 120 can be minimized. Further, the insert pins 120 according to this invention are vertically installed on the upper surface of the printed circuit board 130, so that the length of each insert pin 120 is minimized, thus minimizing parasitic inductance B generated in the insert pins 120.

FIG. 6 is a view illustrating the connector, according to this invention, in a sectional view and an equivalent circuit diagram. As shown in the drawing, the connector is constructed so that the insert pins 120, each having a short length and a simple shape, are installed on one side of the printed circuit board 130. The insert pins 120 are inserted into the contact holes 134 of the printed circuit board 130 to be connected to a transmission line 137. Further, the compensating capacitor 138 is provided at a position around the insert pins 120 mounted on the printed circuit board 130, and generates inverse-phase compensating capacitance C so as to compensate for parasitic capacitance A generated between the neighboring insert pins 120. As such, the compensating capacitor 138 is installed near the insert pins 120, thus minimizing the magnitude of the first parasitic inductance B generated in the transmission line 137 which is provided between the insert pins 120 and the compensating capacitor 138. Further, a second compensating capacitor 139 is additionally installed on the transmission line 137' between the compensating capacitor 138 and the IDC terminals 160, more preferably, the transmission line 137' near the IDC terminals 160, so as to correct phase mismatch caused by the parasitic capacitance, the compensating capacitance, and the parasitic inductance, which are generated in the front end of the transmission line 137'.

Figure 7:
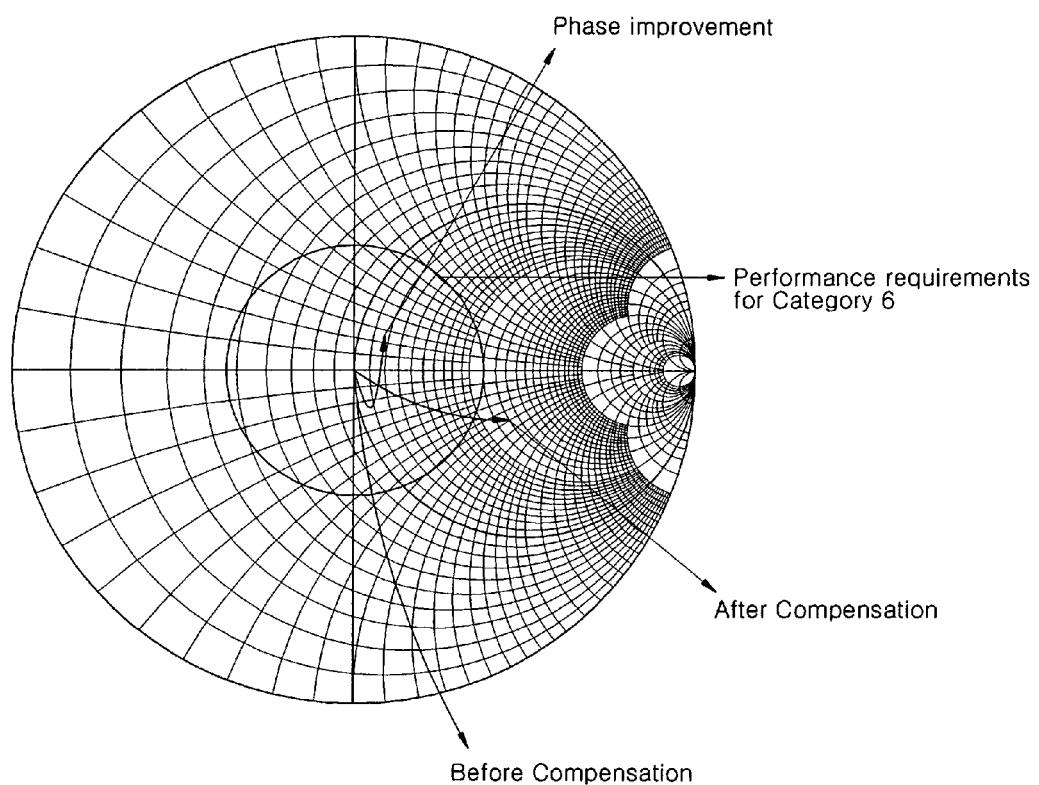
FIG. 7 is a Smith chart representing the progress direction of a real number part and an imaginary number part of crosstalk, according to the present invention.

That is, referring to FIG. 7, a Smith chart representing the progress direction of a real number part and an imaginary number part of crosstalk, according to crosstalk compensation, when a high-frequency signal is applied in the state where the compensating capacitor 138 is not installed, a graph is formed in the lower region of the Smith chart (before compensation). As such, if the imaginary number part is a negative number, it means that a capacitance component exists. Next, when the compensating capacitor 138 is installed and the parasitic capacitor is eliminated, the graph moves upwards in the Smith chart and the real number part is decreased (after compensation). This means that parasitic capacitance is offset by the compensating capacitor 138 and direct-current resistance is reduced. However, the modular jack cannot satisfy performance requirements for Category 6 simply by installing the compensating capacitor 138, because impedance is not matched due to parasitic inductance generated in a high-frequency area, as described above. Thus, when the second compensating capacitor 139 is installed near the IDC terminals 160, like the present invention, the graph in the Smith chart is moved to a region which satisfies the performance required in the category 6.

As described above, the present invention is characterized in that the second compensating capacitor 139 is further installed behind the first compensating capacitor 138 so as to correct phase mismatch caused by parasitic capacitance and parasitic inductance generated when a high-frequency signal is applied to the modular jack 100. In this case, the second compensating capacitor 139 is installed as near the IDC terminals 160 as possible, thus compensating for parasitic inductance D generated in the transmission line 137' between the first compensating capacitor 138 and the second compensating capacitor 139.

As shown in the equivalent circuit diagram of FIG. 6, a crosstalk canceling pattern for high-speed communications, according to the present invention, is formed such that the first parasitic capacitance A, generated in the insert pins 120, and the first parasitic inductance B, generated in the transmission line 137 between the insert pins 120 and the first compensating capacitor 138, are symmetrical to the second parasitic inductance D, generated in the transmission line 137' between the first compensating capacitor 138 and the second compensating capacitor 139, and second compensating capacitance E, generated in the second compensating capacitor 139 installed near the IDC terminals 160, with respect to the compensating capacitance C generated in the first compensating capacitor 138.

In order to form such a symmetrical structure, it is necessary to minimize the first parasitic capacitance A generated in the insert pins 120 and the first parasitic inductance B generated in the transmission line 137 between the insert pins 120 and the first compensating capacitor 138. Thus, as described above, the insert pins 120 must have a simple structure, and neighboring insert pins 120 must not be arranged to be parallel to each other. Further, in order to minimize the parasitic inductance B generated in the insert pins 120 and the transmission line 137 between the insert pins 120 and the first compensating capacitor 138, the first compensating capacitor 138 must be formed as near the insert pins 120 as possible.

Further, the second compensating capacitor 139 must be installed as near the IDC terminals 160 as possible, and the second parasitic inductance D generated in the transmission line 137' between the first compensating capacitor 138 and the second compensating capacitor 139 must be adjusted to be identical to the first parasitic inductance B generated in front of the first compensating capacitor 138. Further, the interference between the capacitors and the transmission lines, formed on the printed circuit board 130, must be prevented.

Figure 8:
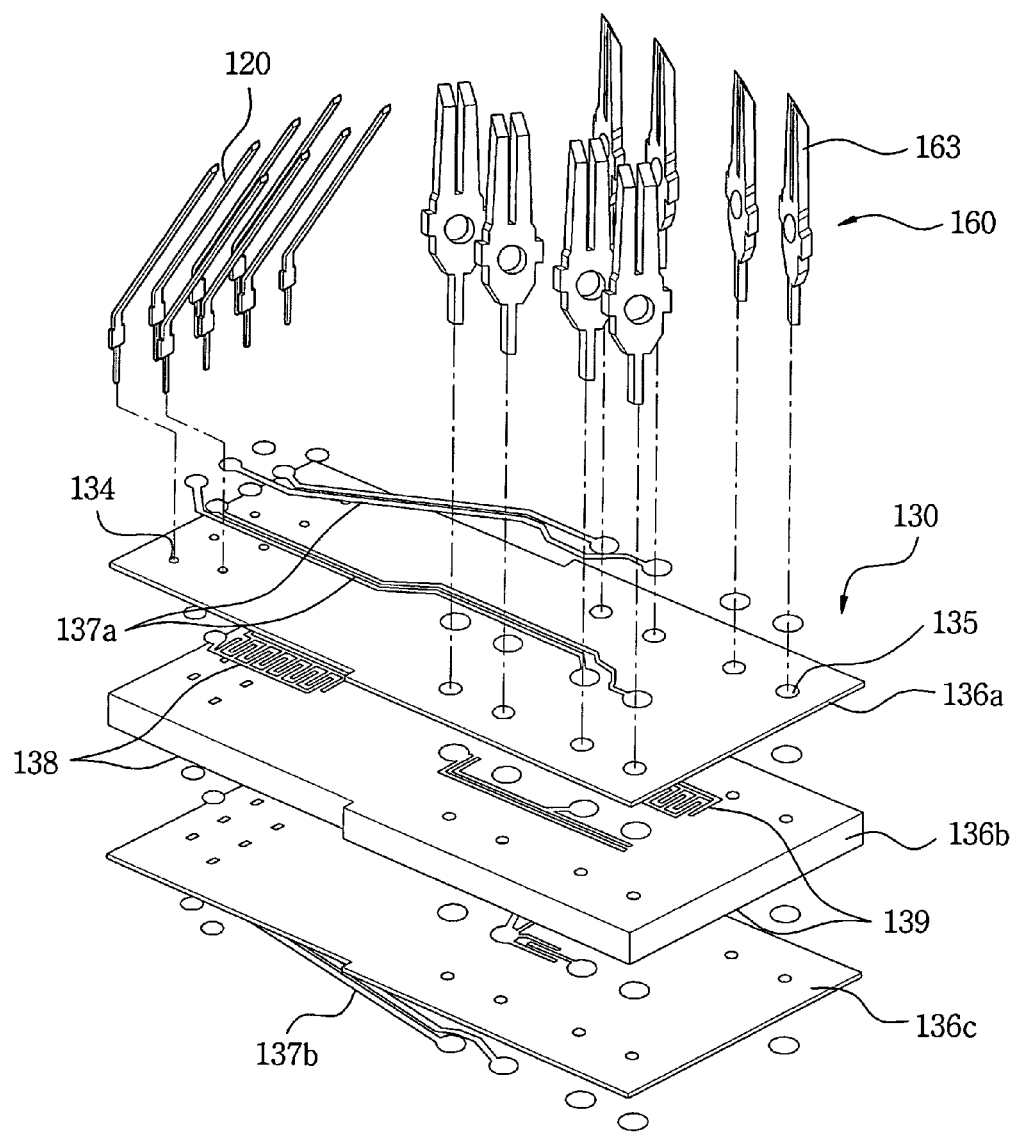
FIG. 8 is an exploded perspective view showing the preferred embodiment of a printed circuit board, according to the present invention.

FIG. 8 is an exploded perspective view showing the preferred embodiment of the printed circuit board, according to the present invention.

As shown in the drawing, the printed circuit board 130 according to this invention has a multi-layered structure. For example, the printed circuit board 130 has three substrates and four patterned layers. Two rows of insert pins 120, arranged in front and rear directions, are inserted into the pin contact holes 134, which are formed in the front portion of the upper surface of the printed circuit board 130 in such a way as to be spaced apart from each other in a zigzag manner. Further, two rows of IDC terminals 160, arranged to the left and right sides, are inserted into terminal contact holes 135, which are formed in the rear portion of the upper surface of the printed circuit board 130. In this case, the insert part 121 of each insert pin 120 and a contact part 161 of each IDC terminal 160 are tightly fitted into an associated pin contact hole 134 and an associated terminal contact hole 135, respectively, without a soldering process.

In a detailed description of this invention, the transmission lines 137a and 137b, extending from the insert pins 120 to the IDC terminals 160, are provided on the upper surface of an upper substrate 136a and the lower surface of a lower substrate 136c. The first compensating capacitor 138, for compensating the first parasitic capacitance generated in the insert pins 120, and the second compensating capacitor 139, for correcting phase mismatch due to the compensating capacitance and the parasitic inductance, are provided on the upper and lower surfaces of a middle substrate 136b. Further, the upper substrate 136a and the lower substrate 136c are compressed to be secured to the upper and lower surfaces of the middle substrate 136b, respectively.

Preferably, the printed circuit board 130 according to the present invention is made of FR4 (glass epoxy) having a dielectric constant of 3.4 or higher so as to prevent capacitive coupling in a high-frequency area. Further, the middle substrate 136b has ample thickness of 1.6 mm or higher, thus preventing capacitive coupling between the capacitors provided on the upper and lower surfaces of the middle substrate 136b. Meanwhile, each of the upper and lower substrates 136a and 136c has a thickness of about 0.2 mm.

Further, each of the IDC terminals 160 has on an end thereof a cutter 163 with two blades so as to strip the insulating sheath from the UTP cable wire. Each IDC terminal 160 is electrically connected to the wire, and serves to maintain firm coupling so as to prevent the printed circuit board 130 from being removed from the lower contact block 140.

Figure 9:
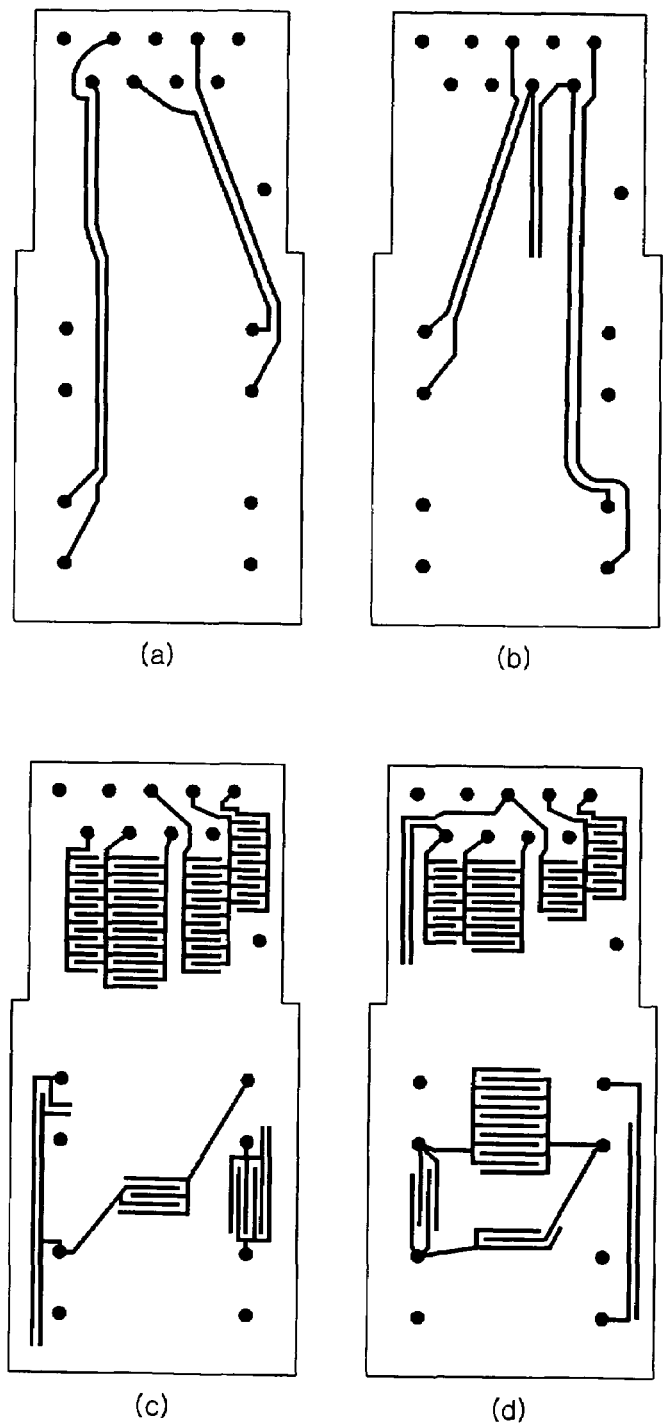
FIGS. 9a to 9d and FIGS. 10a to 10d are circuit diagrams showing the preferred embodiment of a crosstalk canceling pattern formed on the printed circuit board, according to the present invention.
Figure 10:
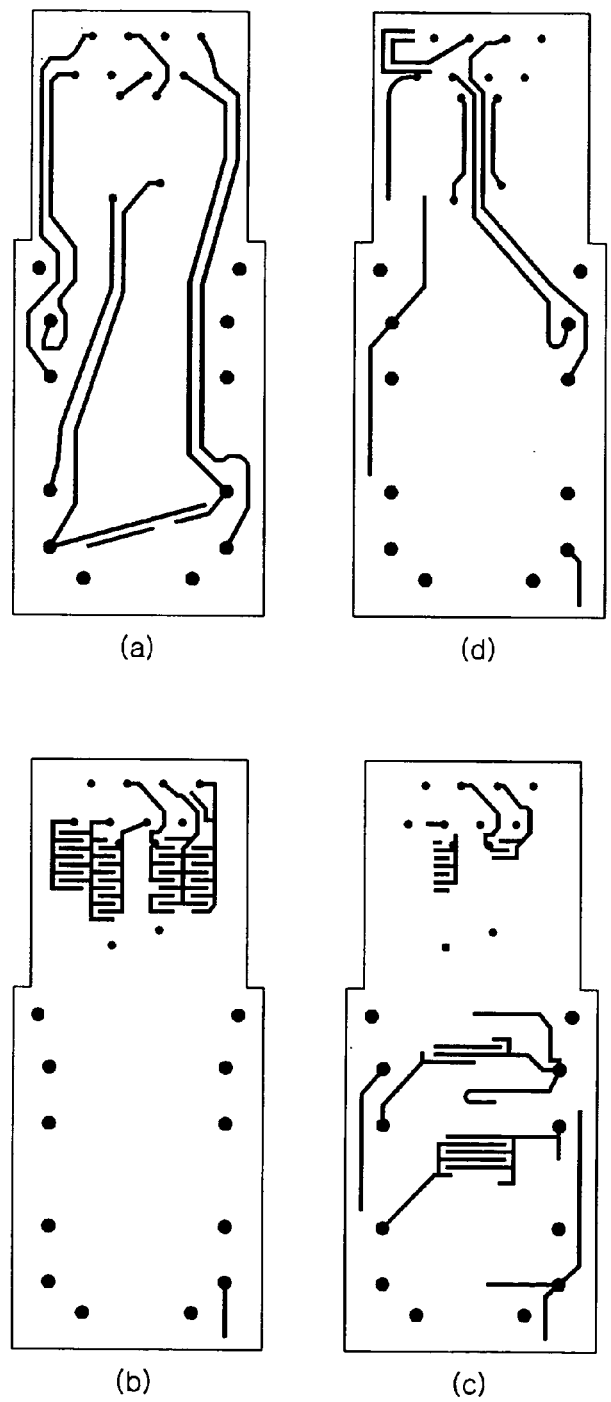

FIGS. 9a to 9d and FIGS. 10a to 10d show the preferred embodiment of a crosstalk canceling pattern formed on the printed circuit board, according to the present invention. As shown in the drawings, FIGS. 9a and 10a show transmission lines formed on the upper surface of the upper substrate 136a, and FIGS. 9b and 10b show transmission lines formed on the lower surface of the lower substrate 136c. Further, FIGS. 9c and 10c show first and second compensating patterns formed on the upper surface of the middle substrate 136b, and FIGS. 9d and 10d show first and second compensating patterns formed on the lower surface of the middle substrate 136b. As shown in the drawings, the first compensating pattern is formed very near the pin contact holes into which the insert pins are inserted, and the second compensating pattern is formed near the terminal contact holes into which the IDC terminals are inserted.

Turning now to FIGS. 4a and 4b, the detailed construction of the crosstalk canceling pattern for high-speed communications and the modular jack having the same will be described below.

In a detailed description, the plug insert hole 115 is formed in the front surface of the housing 110 and has a size to allow the modular plug 2 to be tightly inserted thereinto. A locking protrusion 111 and an elastic hook 112 are provided on the upper and lower surfaces of the housing 110, and have sizes which allow the housing 110 to be detachably mounted to a patch panel or an outlet plate. Further, an insert pin locking plate 118 is provided on the lower portion of the plug insert hole 115 so that the insert pins 120 inserted from the rear portion are locked to the insert pin locking plate 118. A coupling guide part 113 is integrally provided on the rear portion of the housing 110 and has a size to allow the lower surface of the lower contact block 140 to be accommodated therein.

In this case, the coupling guide part 113 of the housing 110 comprises a "U"-shaped plate which is open at a top thereof. Locking holes 114 and slide grooves 117 are formed on the rear portions of both sidewalls of the coupling guide part 113. While the lower contact block 140 slides along the slide grooves 117, locking hooks 142 of the lower contact block 140 are locked to the locking holes 113.

Further, the insert pin locking plate 118 of the housing 110 is provided to be perpendicular to the front surface of the housing 110, and has a height which is suitable for accommodating the height of the stop part of each insert pin 120. Pin guide groves 118a having different depths are provided on the rear portion of the insert pin locking plate 118 to be staggered, so that the insert pins 120 are locked to the corresponding pin guide grooves 118a.

The lower contact block 140 defines the body of the modular jack 100. The printed circuit board 130 is mounted to the lower surface of the lower contact block 140, and the upper contact block 150 is mounted on the upper portion of the lower contact block 140. In such a state, the assembly is mounted to the coupling guide part 113 of the housing 110.

Figure 11A:
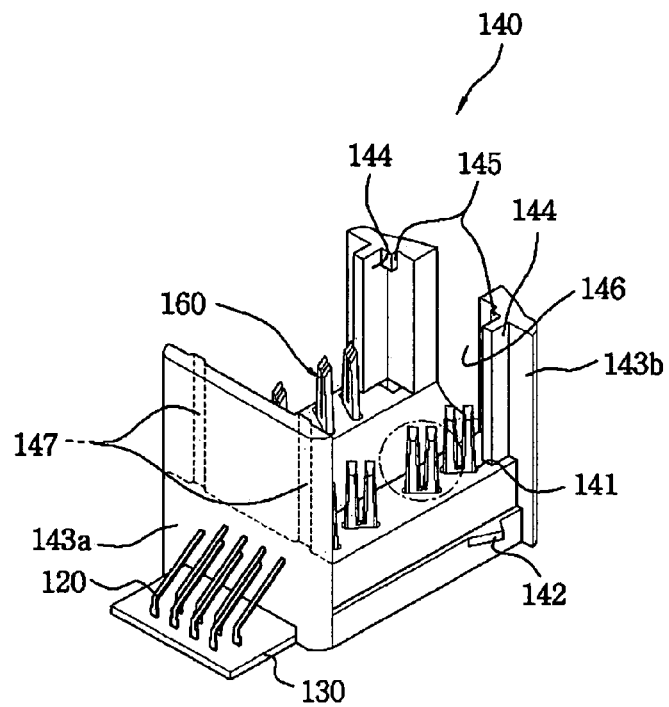
FIG. 11 is a view illustrating the coupling relation between a lower contact block and the IDC terminal, according to the present invention, in a perspective view and a partial sectional view.
Figure 11B:
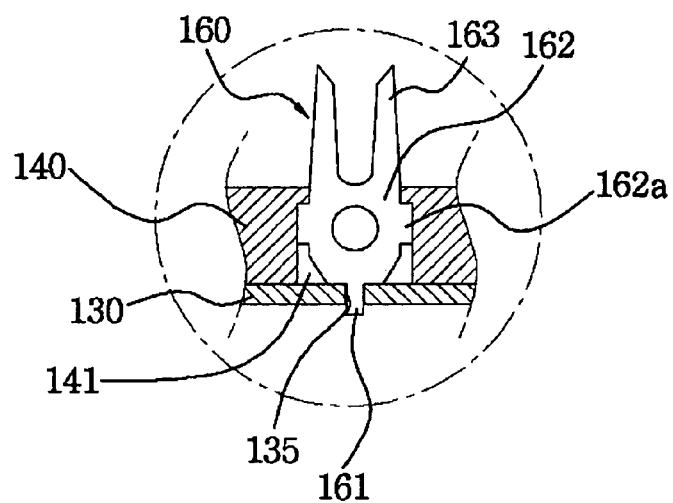

FIG. 11 is a view illustrating the coupling of the lower contact block with the IDC terminals, according to the present invention, in a perspective view and a partial sectional view. Referring to FIGS. 4a and 4b and FIG. 11, a plurality of through holes 141, having a number corresponding to that of the IDC terminals 160 secured to the printed circuit board 130, is formed in the lower contact block 140. The through holes 141 are formed at predetermined angles in such a way as to face each other. In order to prevent impurities from entering the IDC terminals 160 when they are coupled to the lower contact block 140, a front rib wall 143a and rear rib walls 143b are provided on the lower contact block 140 to be higher than the IDC terminals 160 passing through the through holes 141 and lower than the front surface of the housing 110, and have sizes to be accommodated in the coupling guide part 113 of the housing 110. Further, the locking hooks 142 are provided on the both sidewalls of the lower contact block 140 to be slidably locked to the locking holes 114 of the housing 110.

Protruding guide parts 147 are vertically provided on the inner surface of the front rib wall 143a to allow the upper contact block 150 to be easily coupled to the lower contact block 140. A lower cable insert hole 146 is formed in the rear rib walls 143b and has a size allowing the UTP cable to be inserted therein. Upper block guides 144 are vertically provided on the inner surfaces of the rear rib walls 143b. Further, a block locking part 145 is integrally provided to a side of each upper block guide 144, so that a detachable hook 151 of the upper contact block 150 is locked to the block locking part 145.

Thus, the printed circuit board 130 is coupled to the lower portion of the lower contact block 140 while the IDC terminals 160 of the printed circuit board 130 pass through the through holes 141. The upper contact block 150 is coupled to the upper portion of the lower contact block 140 along the protruding guide parts 147 and the upper block guides 144. The assembly is mounted along the coupling guide part 113 of the housing 110. First, the insert pins 120 are inserted into the housing 110, and the locking hooks 142 provided on both sidewalls slide along the slide grooves 117 of the housing 110 to be locked to the locking holes 114. In this way, the assembly is coupled to the housing 110.

Referring to FIG. 5b, each of the IDC terminals 160 passing through the through holes 141 of the lower contact block 140 includes a contact part 161, a terminal body 162, and a cutter 163. The contact part 161 has a length which is suitable for passing through an associated terminal contact hole 135 of the printed circuit board 130. The terminal body 162 extends from the contact part 161, and has a size to be held in an associated through hole 141 of the lower contact block 140, with locking parts 162a protruding from both sides of the terminal body 162. The cutter 163 comprising two blades is provided on the upper end of the terminal body 162, and functions to strip the UTP cable.

Therefore, referring to FIG. 11, the size of an outlet of each through hole 141 of the lower contact block 140 is set so that the cutter 163 of each IDC terminal passes through the outlet and the locking parts 162a of the terminal body are stopped by the outlet. The contact parts 161 of the IDC terminals 160 are inserted into the terminal contact holes 135 of the printed circuit board 130, and the locking parts 162a of each terminal body are stopped by the corresponding through hole 141, so that the IDC terminals 160 are secured to the printed circuit board 130.

Figure 12:
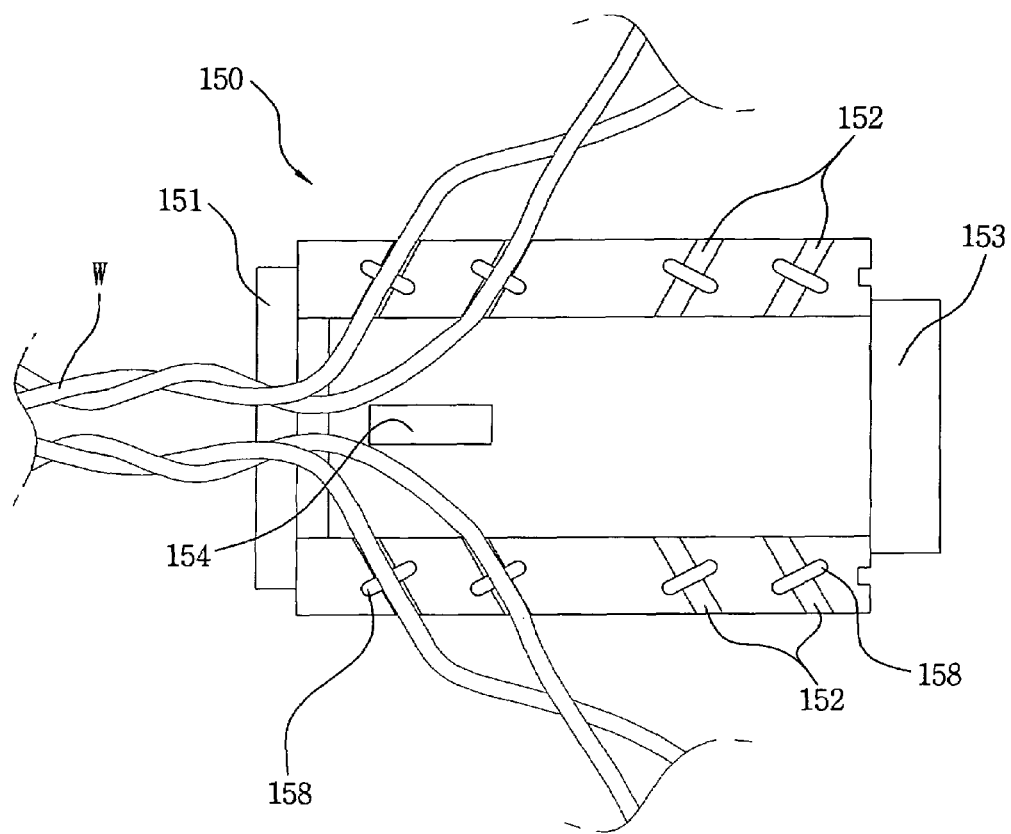
FIG. 12 is a plan view showing the lower portion of an upper contact block, according to the present invention.

Further, the upper contact block 150 electrically connects the UTP cable wires to the printed circuit board 130 through the IDC terminals 160. Referring to FIGS. 4a and 4b and FIG. 12, which is a plan view showing the lower portion of the upper contact block according to the present invention, the upper contact block 150 includes an upper plate 155 and side plates 157. The upper plate 155 has a size suitable for covering the lower contact block 140. Terminal insert holes 158 are formed in the lower portions of the side plates 157 so that the IDC terminals 160 are inserted into the terminal insert holes 158. The upper contact block 150 divides the UTP cable wires W, and connects the UTP cable wires W to the IDC terminals 160.

In this case, the upper surface of the upper plate 155 of the upper contact block 150 comprises a concave bent surface to allow a user to easily catch and compress the upper contact block 150. A protective cover 153 protrudes from the front end of the upper plate 155 so as to prevent impurities from entering the assembly of the upper contact block 150 with the lower contact block 140.

Further, the detachable hook 151 is provided on the rear portion of the upper contact block 150 to be locked to the block locking parts 145 of the lower contact block 140. An upper cable insert hole 156 is formed in the rear surface of the upper contact block 150 so that the UTP cable is inserted into the upper cable insert hole 156. Wire insert holes 152 are formed in the lower portions of the side plates 157 of the upper contact block 150 so that the cable wires W introduced through the cable insert hole 156 are diagonally inserted into both sides of the upper contact block 150. The wire insert holes 152 are at right angles to the terminal insert holes 158 into which the IDC terminals 131 of the printed circuit board 130 are inserted, and have numbers and positions corresponding those of the terminal insert holes 158.

Further, a protrusion 154 having a predetermined size is provided on the lower surface of the upper plate 155 to divide the introduced UTP cable wires W and guide the wires W into the wire insert holes 152 which are formed in both sides of the upper plate 155. Preferably, an insert hole having the same size as the upper cable insert hole 156 is formed in the front surface of the upper contact block 150. Guide grooves 154 are provided on the front surface of the upper contact block 150 to correspond to the protruding guide parts 147 of the lower contact block 140, and have sizes to allow the protruding guide parts 147 to slidably engage with the guide grooves.

Thus, the UTP cable wires W are introduced through the upper cable insert hole 156 of the upper contact block 150. The introduced cable wires W are divided by the protrusion 154 to be positioned in the wire insert holes 158. Further, the upper contact block 150 is mounted to the upper portion of the lower contact block 140, which has been coupled to the printed circuit board 130. At this time, the UTP cable passes through the lower cable insert hole 146 of the lower contact block 140, which is formed at a position corresponding to the upper cable insert hole 156 of the upper contact block. When the upper plate 155 of the upper contact block 150 is compressed down, insulating sheathes are stripped from the UTP cable wires by the cutters 163 of the IDC terminals 160 inserted into the terminal insert holes 158, so that the UTP cable wires are electrically connected to each other.

The assembly and operation of the crosstalk canceling pattern for high-speed communications and the modular jack having the same will be described below with reference to FIGS. 4a, 4b, and 6.

The insert part 121 of each insert pin 120 is vertically electrically connected to the printed circuit board 130. When the printed circuit board 130 is coupled to the lower portion of the lower contact block 140, the IDC terminals 160 pass through the through holes 141 of the lower contact block 140, and the locking parts 162a of the IDC terminals 160 are stopped by the through holes 141 having narrow outlets.

Further, the locking hooks 142 of the lower contact block 140 slide along the slide grooves 117 of the coupling guide part 113 provided on the rear portion of the housing 110 to be locked to the locking holes 114. The guide grooves 154 of the upper contact block 150 engage with the protruding guide parts 147 of the lower contact block 140, and the detachable hook 151 of the upper contact block 150 is locked to the block locking parts 145 along the upper block guides 144, so that the upper contact block 150 is coupled to the upper portion of the lower contact block 140. At this time, the UTP cable wires connected to the wire insert holes 152 are stripped by the cutters 163 of the IDC terminals of the printed circuit board 130 to be electrically connected to each other.

Further, the insert pins 120 have a structure capable of minimizing parasitic capacitance and parasitic inductance which are generated when a high-frequency signal is applied. According to the present invention, neighboring insert pins 120 are spaced apart from each other in front and rear directions by a predetermined distance, thus minimizing the first parasitic capacitance A generated between the insert pins 120. Further, according to this invention, the insert pins 120 are vertically installed on the upper surface of the printed circuit board 130, thus minimizing the length of the insert pins 120, therefore minimizing the first parasitic inductance B generated in the insert pins 120. Further, the first compensating capacitor 138 is installed near the insert pins 120, thus minimizing the magnitude of the first parasitic inductance B generated in the transmission line 137 between the insert pins 120 and the compensating capacitor 138. As such, the first capacitance and the first parasitic inductance B are minimized, thus allowing the crosstalk canceling pattern to have a symmetrical structure.

Therefore, after the connector is inserted to be coupled to the rear portion of the modular jack 100, the wires W of the UTP cable are connected to the IDC terminals 160 through the lower contact block 140 and the upper contact block 150. Subsequently, when the modular plug 2 is inserted into the plug insert hole 115 of the modular jack 100, the terminal of the modular plug 2 is electrically connected to the insert pins 120 to be connected to the IDC terminals 160. In such a state, when a predetermined high-frequency signal is applied, the first parasitic capacitance A is generated between the insert pins 120 contacting the terminal of the modular plug 2, and the first parasitic inductance B is generated in the insert pins 120 and the transmission line 137 between the insert pins 120 and the first compensating capacitor 138. At this time, the first parasitic capacitance A and the first parasitic inductance B are minimized, as described above.

Next, the inverse-phase compensating capacitance C is generated in the first compensating capacitor 138 to offset the first parasitic capacitance A. Further, the second parasitic inductance D caused by high frequency is generated in the transmission line 137' between the first compensating capacitor 138 and the second capacitor 139. In this case, the length of the second parasitic inductance D and the first parasitic inductance B is adjusted so that they have a symmetrical structure. Further, the second compensating capacitance E is generated in the second compensating capacitor 139 to correct phase mismatch caused by the first parasitic capacitance A, the second parasitic inductance B, the compensating capacitance C, and the second parasitic inductance D, which are generated in front of the second compensating capacitor 139.

Further, the insert pins 120 and the IDC terminals 160 are secured to the printed circuit board 130 without a soldering process, thus increasing contact efficiency.

As such, the crosstalk canceling pattern according to this invention provides a canceling pattern having a symmetrical structure to cancel the parasitic capacitance as well as the parasitic inductance generated in the high-frequency area, thus satisfying the performance requirements for Category 6 that is required in high-speed communications.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

As described above, the present invention provides a crosstalk canceling pattern for high-speed communications and a modular jack having the same, which satisfies performance requirements for Category 6 capable of transmitting up to 250 MHz per pair in UTP 4 pair cable.

Further, the present invention provides a crosstalk canceling pattern for high-speed communications and a modular jack having the same, constructed so that first parasitic capacitance and first parasitic inductance generated in front of a first compensating capacitor are symmetrical to second parasitic inductance and second compensating capacitance generated in back of the first compensating capacitor, thus correcting phase mismatch, therefore permitting high-speed communications.

Further, wires are connected by hand without using an additional work tool, and the modular jack has a small size, so that the manufacturing process is simple and mass production is convenient. Further, when insert pins and IDC terminals are mounted on a printed circuit board, a soldering process is not used, thus preventing poor contact and enhancing a high quality when being used.

What is claimed is:

1. A modular jack having a crosstalk canceling pattern for high-speed communications, the modular jack comprising a plurality of insert pins electrically connected to a modular plug, a plurality of IDC terminals connected to an UTP cable, a printed circuit board connecting the insert pins to the IDC terminals via a transmission line, and a first compensating capacitor provided on a transmission line of the printed circuit board to compensate for first parasitic capacitance generated between the insert pins, wherein first parasitic inductance generated in the insert pins and a transmission line between the insert pins and the first compensating capacitor, and second parasitic inductance generated in a transmission line between the first compensating capacitor and the IDC terminals are symmetrical with respect to the first compensating capacitor; and a second compensating capacitor, generating second compensating capacitance, is provided in a transmission line adjacent to the IDC terminals so as to correct phase mismatch, due to an increase in capacitance caused by the first compensating capacitor and an increase in the first and second parasitic inductance.

2. The modular jack as set forth in claim 1, wherein the modular jack is constructed so that generation of the first parasitic capacitance and the first parasitic inductance generated in front of the first compensating capacitor is limited to be as small as possible, thus allowing the first parasitic capacitance and the first parasitic inductance to be more easily symmetrical to the second parasitic inductance and the second compensating capacitance generated in back of the first compensating capacitance.

3. The modular jack as set forth in claim 1, wherein the insert pins are vertically installed in such a way as to be spaced apart from each other by a predetermined distance in front and rear directions, so that inclination angles of the neighboring insert pins are differently changed when the insert pins are pressed by the modular plug, and the insert pins are not arranged to be parallel to each other but are staggered.

4. The modular jack as set forth in claim 3, wherein each of the insert pins is formed to be as short as possible, thus minimizing the magnitude of the parasitic inductance generated in the insert pins.

5. The modular jack as set forth in claim 1, wherein the first compensating capacitor is installed as near the insert pins as possible, thus minimizing the magnitude of the first parasitic inductance generated in the transmission line between the insert pins and the first compensating capacitor.

6. The modular jack as set forth in claim 1, wherein the second parasitic inductance generated in the transmission line between the first compensating capacitor and the IDC terminals is symmetrical to the first parasitic inductance generated in front of the first compensating capacitor.

7. The modular jack as set forth in claim 1, wherein the printed circuit board comprises three substrates and four patterned layers, transmission lines extending from the insert pins to the IDC terminals are formed on an upper surface of an upper substrate and a lower surface of a lower substrate, and the first compensating capacitor for compensating the first parasitic capacitance generated in the insert pins and the second compensating capacitor for correcting phase mismatch due to compensating capacitance and parasitic inductance are provided on upper and lower surfaces of a middle substrate.

8. The modular jack as set forth in claim 7, wherein the upper and lower substrates are compressed to be secured to the upper and lower surfaces of the middle substrate, respectively.

9. The modular jack as set forth in claim 7, wherein the printed circuit board is made of a material having a dielectric constant of 3.0 or higher, thus preventing capacitive coupling in a high-frequency area.

10. The modular jack as set forth in claim 7, wherein the middle substrate has ample thickness of 1.6 mm or higher.

11. The modular jack as set forth in claim 1, comprising:

a housing into which a modular plug is inserted;

upper and lower contact blocks into which an UTP cable is introduced; and a printed circuit board to connect insert pins, electrically connected to the modular plug, to a plurality of IDC terminals connected to the UTP cable via a transmission line, wherein the housing comprises:

a plug insert hole formed in a front surface of the housing so that the modular plug is tightly inserted into the plug insert hole;

an insert pin locking plate provided on a lower portion of the plug insert hole so that the insert pins inserted through a rear portion of the housing are locked to the insert pin locking plate; and a coupling guide part integrally provided on the rear portion of the housing, and having a size which is suitable for accommodating a lower surface of the lower contact block;

the insert pins are locked to the insert pin locking plate, and contact the transmission line of the printed circuit board along the shortest possible distance;

the printed circuit board comprises a multi-layered structure having a plurality of compensating capacitors, with the insert pins and the IDC terminals passing through the printed circuit board;

the lower contact block is coupled at a lower surface thereof to the printed circuit board, and comprises:
a plurality of through holes formed at positions corresponding to the IDC terminals; and
front and rear rib walls provided to be higher than the IDC terminals passing through the through holes and be lower than the front surface of the housing, so that the lower contact block is slidably coupled to the housing along the coupling guide part thereof; and the upper contact block comprises:
an upper plate having a size suitable for covering the lower contact block; and
side plates having terminal insert holes so that the IDC terminals are inserted into the terminal insert holes, so that the upper contact plate divides wires of the UTP cable introduced through a rear portion of the upper contact block, and connect the wires to the IDC terminals.

12. The modular jack as set forth in claim 11, wherein each of the insert pins comprises:
an insert part having a length which is suitable for passing through the printed circuit board;
a protruding stop part stopped by an upper surface of the printed circuit board; and
a bent part provided on an upper end of the stop part.

13. The modular jack as set forth in claim 11, wherein the insert part of each of the insert pins passes vertically through an associated pin contact hole of the printed circuit board to be connected to the transmission line, the stop part of each of the insert pins is stopped by the upper surface of the printed circuit board in such a way as to be in surface contact with the printed circuit board, and the bent part of each of the insert pins is bent toward the rear portion of the housing and is inclined at a predetermined angle to be in surface contact with a terminal of the modular plug.

14. The modular jack as set forth in claim 11, wherein the coupling guide part of the housing comprises a "U"-shaped plate which is open at an upper portion thereof, with locking holes and slide grooves being formed on rear portions of side walls of the coupling guide part.

15. The modular jack as set forth in claim 11, wherein the insert pin locking plate has a height which is suitable for accommodating a length of the stop part of each of the insert pins, and is positioned to be perpendicular to the front surface of the housing, with deep pin guide grooves and shallow pin guide grooves being provided on a rear portion of the insert pin locking plate in such a way as to be staggered.

16. The modular jack as set forth in claim 11, wherein two rows of insert pins pass through pin contact holes formed in a front portion of an upper surface of the printed circuit board in such a way as to be spaced apart from each other in front and rear directions in a zigzag manner, and two rows of IDC terminals pass through terminal contact holes formed in left and right sides of a rear portion of the upper surface of the printed circuit board.

17. The modular jack as set forth in claim 16, wherein each of the IDC terminals comprises:

a contact part having a length which is suitable for passing through an associated terminal contact hole of the printed circuit board;
a terminal body extending from the contact part, having a locking part which protrudes to a side of the terminal body, and having a size to be accommodated in an associated through hole of the lower contact block; and
a cutter provided on an upper end of the terminal body and comprising two blades.

18. The modular jack as set forth in claim 11, wherein the lower contact block integrally comprises:
locking hooks protruding from both side surfaces thereof, and engaging with the locking holes of the housing;
a protruding guide part vertically provided on an inner surface of the front rib wall;
a lower cable insert hole formed in the rear rib wall, and having a size to allow the UTP cable to be introduced through the rear rib wall;
an upper block guide vertically formed on an inner surface of the rear rib wall; and
a block locking part provided at a position around the upper block guide, and engaging with a detachable hook of the upper contact block.

19. The modular jack as set forth in claim 11, wherein the lower contact block comprises a plurality of through holes, the size of an outlet of each of the through holes being set to allow the cutter of each of the IDC terminals to pass through the outlet and allow the locking part of the terminal body of each of the IDC terminals to be stopped by the outlet.

20. The modular jack as set forth in claim 11, wherein the upper contact block comprises:
the upper plate comprising a bent surface which is concave at an upper surface thereof;
a protective cover protruding from a front end of the upper plate;
a guide groove vertically formed on a front surface of the upper contact block;
the detachable hook provided on a rear portion of the upper contact block, and locked to the block locking part of the lower contact block;
an upper cable insert hole formed in a rear surface of the upper contact block so that the UTP cable is inserted into the upper cable insert hole;
wire insert holes formed on lower portions of both side plates of the upper contact block in such a way as to be perpendicular to the terminal insert holes, so that the wires of the cable inserted into the cable insert hole are inserted into the wire insert holes in diagonal directions; and
a protrusion protruding from a lower surface of the upper plate, and dividing the wires of the introduced UTP cable, to be inserted into the wire insert holes.

21. A crosstalk canceling pattern installed on a printed circuit board of a modular jack for high-speed communications and canceling crosstalk, wherein
the printed circuit board comprises three substrates, transmission lines extending from insert pins to IDC terminals are formed on an upper surface of an upper substrate and a lower surface of a lower substrate, and a first compensating capacitor for compensating for first parasitic capacitance generated in the insert pins and a second compensating capacitor for correcting phase mismatch due to compensating capacitance generated in the first compensating capacitor and parasitic inductance generated in the insert pins and the transmission lines are provided on upper and lower surfaces of a middle substrate.

22. The crosstalk canceling pattern as set forth in claim 21, wherein the first compensating capacitor is installed near the insert pins, and the second compensating capacitor is installed near the IDC terminals.

23. A crosstalk canceling pattern for high-speed communications, having a first compensating capacitor which generates inverse-phase compensating capacitance so as to offset parasitic capacitance generated between a plurality of insert pins, wherein a second compensating capacitor is provided in back of the first compensating capacitor, and generates second compensating capacitance to correct phase mismatch due to parasitic capacitance and inductance generated in front of the first compensating capacitor, and the magnitude of first parasitic capacitance and second parasitic inductance is minimized so that the first parasitic capacitance generated in front of the compensating capacitance and first parasitic inductance generated in the insert pins and a transmission line between the insert pins and the compensating capacitor, are symmetrical to second compensating capacitance generated in back of the compensating capacitance and second parasitic inductance generated in a transmission lines between the compensating capacitor and IDC terminals.

* * * * *